US009935195B1

(12) United States Patent
Xu et al.

(10) Patent No.: US 9,935,195 B1
(45) Date of Patent: Apr. 3, 2018

(54) REDUCED RESISTANCE SOURCE AND DRAIN EXTENSIONS IN VERTICAL FIELD EFFECT TRANSISTORS

(71) Applicant: INTERNATIONAL BUSINESS MACHINES CORPORATION, Armonk, NY (US)

(72) Inventors: Peng Xu, Guilderland, NY (US); Chun W. Yeung, Niskayuna, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/404,904

(22) Filed: Jan. 12, 2017

(51) Int. Cl.
| | |
|---|---|
| H01L 29/78 | (2006.01) |
| H01L 29/66 | (2006.01) |
| H01L 21/311 | (2006.01) |
| H01L 21/02 | (2006.01) |
| H01L 29/08 | (2006.01) |

(52) U.S. Cl.
CPC ...... *H01L 29/7827* (2013.01); *H01L 21/0217* (2013.01); *H01L 21/02178* (2013.01); *H01L 21/31111* (2013.01); *H01L 29/0847* (2013.01); *H01L 29/6653* (2013.01); *H01L 29/66666* (2013.01)

(58) Field of Classification Search
USPC .......................................................... 257/329
See application file for complete search history.

(56) References Cited

U.S. PATENT DOCUMENTS

| | | | |
|---|---|---|---|
| 7,446,025 B2 | 11/2008 | Cohen et al. | |
| 7,892,956 B2 | 2/2011 | Deligianni et al. | |
| 7,977,740 B2 | 7/2011 | Hebert et al. | |
| 8,471,249 B2 | 6/2013 | Chiu et al. | |
| 8,637,849 B2 | 1/2014 | Deligianni et al. | |
| 8,796,761 B2 | 8/2014 | Hirler et al. | |
| 9,379,238 B2 | 6/2016 | Larrieu | |
| 9,647,120 B1 * | 5/2017 | Bi | H01L 29/785 |
| 2009/0108324 A1 * | 4/2009 | Zhu | H01L 21/28282 257/316 |
| 2013/0264583 A1 | 10/2013 | Hayashi | |
| 2016/0197070 A1 | 7/2016 | Zundel et al. | |

OTHER PUBLICATIONS

N.M. Terlinden et al., Role of field-effect on c-Si surface passivation by ultrathin (2-20 nm) atomic layer deposited Al2O3, Applied Physics Letters 96, Mar. 2010.
Zhaoyang Liu et al., Investigation of the interface between LPCVD-SiNx gate dielectric and III-nitride for AlGaN/GaN MIS-HEMTs, Journal of Vaccuum Science and Technology, Dec. 2016.

* cited by examiner

*Primary Examiner* — Marcos D Pizarro
*Assistant Examiner* — Lawrence Tynes, Jr.
(74) *Attorney, Agent, or Firm* — Tutunjian & Bitetto, P.C.; Vazken Alexanian

(57) ABSTRACT

Semiconductor devices and methods of forming the same include forming semiconductor fins on a semiconductor substrate. A bottom source/drain region is formed in the semiconductor substrate. First charged dielectric spacers are formed on sidewalls of the semiconductor fins. A gate stack is formed over the bottom source/drain region. Second charged dielectric spacers are formed on sidewalls of the fin above the gate stack. The fins are recessed to a height below a top level of the second charged dielectric spacers. A top source/drain region is grown from the recessed fins.

19 Claims, 10 Drawing Sheets

REDUCED RESISTANCE SOURCE AND DRAIN EXTENSIONS IN VERTICAL FIELD EFFECT TRANSISTORS

BACKGROUND

Technical Field

The present invention generally relates to vertical field effect transistors and, more particularly, to processes and structures to reduce the resistance of source and drain regions in vertical field effect transistors.

Description of the Related Art

The resistance of source and drain regions in vertical field effect transistors (FETs) affects the electrical properties of every such device on an integrated chip. In particular, a higher resistance in these structures results in higher power draw and higher heat production. As devices scale to ever-smaller sizes, the resistance of the source and drain regions increases proportionally.

Each vertical FET has a top source/drain and a bottom source/drain and respective source/drain extensions. The bottom source/drain extension can be doped by diffusion from a highly-doped source/drain region. The resistance of the bottom source/drain extension can be decreased by increasing the amount of dopant. However, dopant diffusion produces a dopant gradient that can result in dopant reaching the FET's channel, which can degrade gate electrostatics and increase overlap capacitance.

Formation of the top source/drain extension has the same problem as the formation of the bottom source/drain extension, but may involve additional complications. If the gate stack is already in place, high-temperature diffusion should be avoided. One solution is to first etch back semiconductor fins to the bottom of a top spacer and epitaxially grow the highly doped extension region. However, this etch is difficult to control with precision, and an overetch can lead to high overlap capacitance, while an underetch can lead to high extension resistance.

SUMMARY

A method of forming a semiconductor device includes forming semiconductor fins on a semiconductor substrate. A bottom source/drain region is formed in the semiconductor substrate. First charged dielectric spacers are formed on sidewalls of the semiconductor fins. A gate stack is formed over the bottom source/drain region. Second charged dielectric spacers are formed on sidewalls of the fin above the gate stack. The fins are recessed to a height below a top level of the second charged dielectric spacers. A top source/drain region is grown from the recessed fins.

A method for forming a semiconductor device includes forming semiconductor fins on a semiconductor substrate. A bottom source/drain region is formed in the semiconductor substrate. First charged dielectric spacers are formed on sidewalls of the semiconductor fins. A bottom spacer is formed on the bottom source/drain region after forming the first charged dielectric spacers. A gate stack is formed over the bottom source/drain region. Second charged dielectric spacers are formed on sidewalls of the fin above the gate stack. An upper spacer is formed on the gate stack after forming the second charged dielectric spacers. The fins are recessed to a height below a top level of the second charged dielectric spacers. A top source/drain region is grown from the recessed fins.

A semiconductor device includes one or more semiconductor fins formed on a semiconductor substrate. A bottom source/drain region is formed in the semiconductor substrate and a bottom portion of the one or more semiconductor fins. A gate stack is formed above the first charged dielectric spacers. First charged dielectric spacers are formed on sidewalls of the semiconductor fins below the gate stack. Second charged dielectric spacers are formed on sidewalls of the semiconductor fins above the gate stack. A top source/drain region is formed above the gate stack and the semiconductor fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide source/drain extensions for vertical field effect transistors (FETs) that use a layer of charged dielectric material along the extension regions. The layer of charged dielectric material induces additional mobile charges in the extension region, thereby reducing the extension resistance. The charges provide a local electric field that increases the free carrier density in the extension region. The processes described herein further provide natural self-alignment and circumvent the tradeoff between extension resistance and short-channel effect that result from diffusion gradients.

Figure 1:
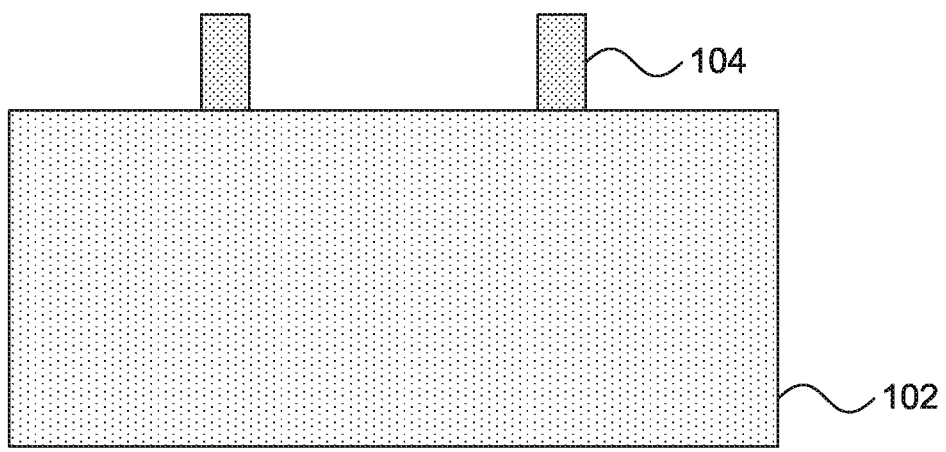
FIG. 1 is a cross-sectional diagram of a step in the formation of vertical field effect transistors (FETs) that have reduced source/drain resistance in accordance with an embodiment of the present invention.

Referring now to the drawings in which like numerals represent the same or similar elements and initially to FIG. 1, a cross-sectional view of a step in the fabrication of a vertical FET is shown. A hardmask 104 is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The hardmask 104 may be formed from, e.g., silicon nitride or any other appropriate hardmask material.

Figure 2:
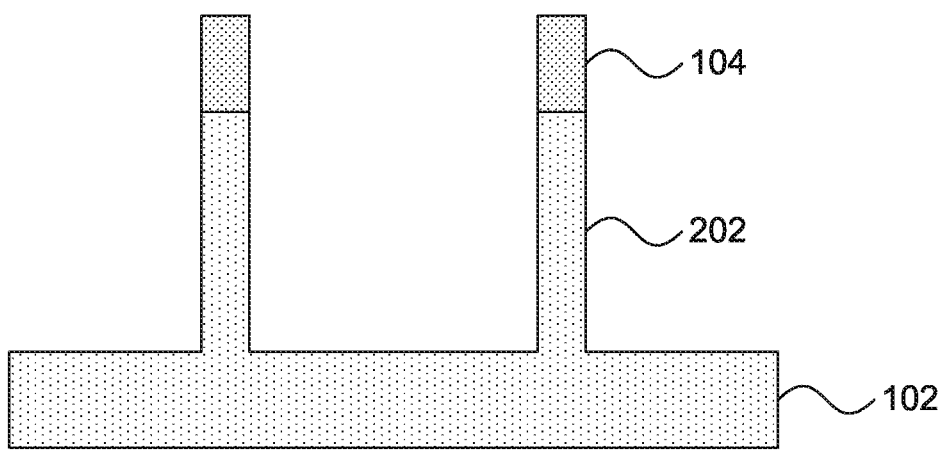
FIG. 2 is a cross-sectional diagram of a step in the formation of vertical FETs that have reduced source/drain resistance in accordance with an embodiment of the present invention.

Referring now to FIG. 2, a cross-sectional view of a step in the fabrication of a vertical FET is shown. Fins 202 are formed in the substrate 102 by anisotropically etching the substrate 102 around the hardmask 104. It is specifically contemplated that a selective reactive ion etch (RIE) may be used to form the fins 202, but any appropriate etch may be used instead. As used herein, the term "selective" in reference to a material removal process denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fins 202 can be formed by spacer imaging transfer.

Figure 3:
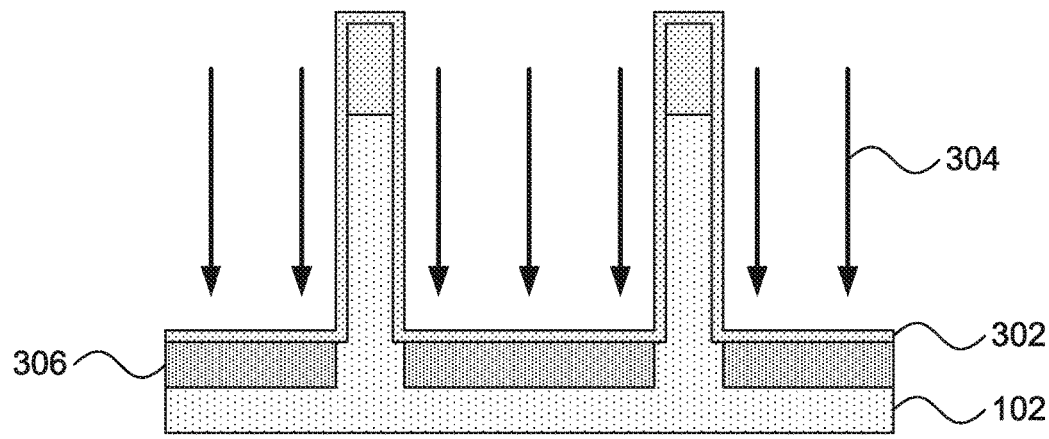
FIG. 3 is a cross-sectional diagram of a step in the formation of vertical FETs that have reduced source/drain resistance in accordance with an embodiment of the present invention.

Referring now to FIG. 3, a cross-sectional view of a step in the fabrication of a vertical FET is shown. A thin protective film 302 is conformally formed over the fins 202 and the substrate 102. It is specifically contemplated that the protective film 302 may be formed from silicon nitride, but any appropriate material may be used instead. The protective film 302 protects the sidewalls of the fins 202 from dopant implantation 304.

Dopant implantation may be performed using, e.g., an ion implantation process that uses electric fields to accelerate dopant ions to high energy and to bombard the surface of the substrate 102. The thin protective film 302 is sufficient to prevent the downward moving ions from implanting in the fins 202, but the ions penetrate the horizontal surfaces of the thin protective film 302 to infiltrate the substrate 102. It is specifically contemplated that a dopant concentration between about $10^8$ cm$^{-3}$ and about $10^{22}$ cm$^{-3}$ may be implanted, but concentrations greater or lesser than that range are also contemplated.

The thin protective film 302 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The dopant type will depend on the desired device type and may be either n-type dopant or p-type dopant. As used herein, "n-type" refers to the addition of impurities that contribute free electrons to an intrinsic semiconductor. In a silicon containing substrate, examples of n-type dopants, i.e., impurities, include but are not limited to antimony, arsenic and phosphorous. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

Figure 4:
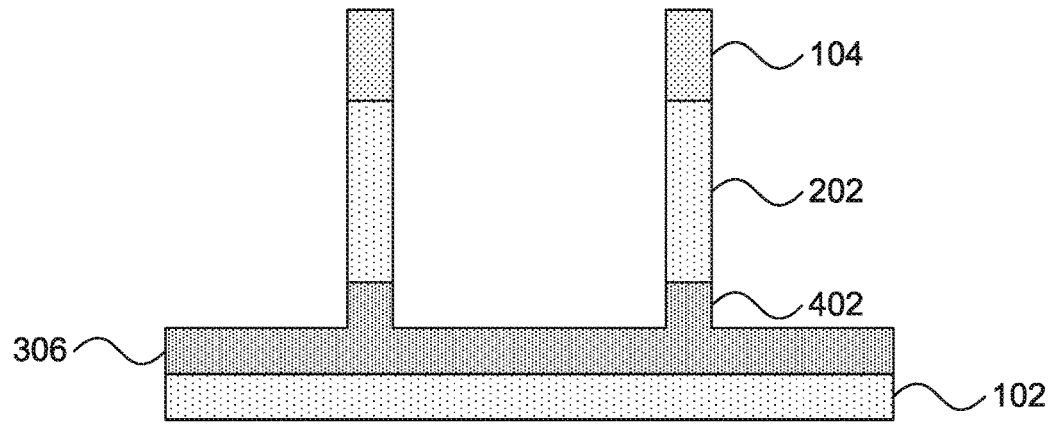
FIG. 4 is a cross-sectional diagram of a step in the formation of vertical FETs that have reduced source/drain resistance in accordance with an embodiment of the present invention.

Referring now to FIG. 4, a cross-sectional view of a step in the fabrication of a vertical FET is shown. The thin protective film 302 is removed by any appropriate etching process such as, e.g., a timed, isotropic, wet or dry chemical etch. The structures are heated to encourage diffusion of the dopants 306 to fill in the volume of the substrate 102 underneath the fins 202 as well as a bottom portion 402 of the fins 202.

Figure 5:
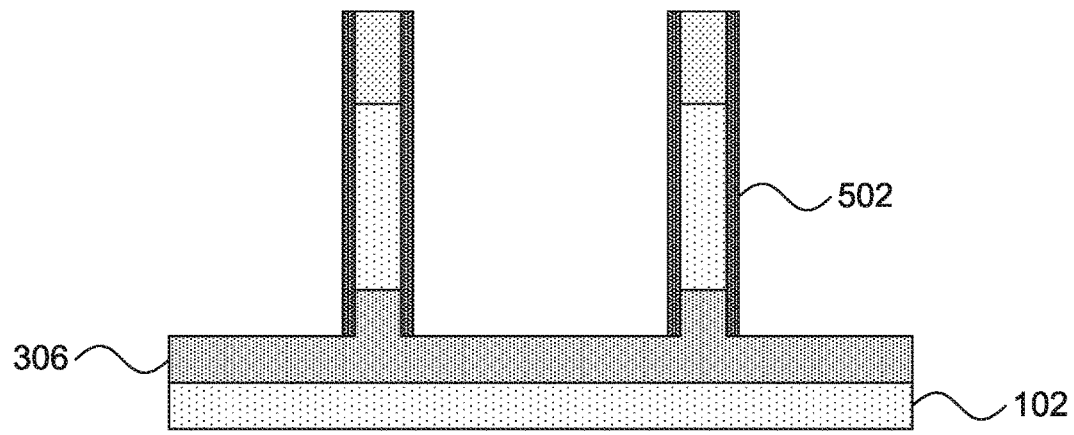
FIG. 5 is a cross-sectional diagram of a step in the formation of vertical FETs that have reduced source/drain resistance in accordance with an embodiment of the present invention.

Referring now to FIG. 5, a cross-sectional view of a step in the fabrication of a vertical FET is shown. A layer of charged dielectric material is deposited using, any appropriate deposition process such as, e.g., CVD, ALD, etc. The charged dielectric material is then etched away from the horizontal surfaces using a selective anisotropic etch such as, e.g., RIE. It is specifically contemplated that the dielectric material used may be, e.g., silicon nitride, though it should be understood that other materials such as aluminum oxide may be used instead. In particular embodiments, silicon nitride may be used for n-type FETs and aluminum oxide may be used for p-type FETs. Charged spacers 502 remain on the sidewalls of the fins 202. Silicon nitride and aluminum oxide can hold charges of about $10^{13} C/cm^2$ at their interface with the semiconductor fins 202. Assuming a fin width of about 8 nm, this means that there may be about 2.5 e19/$cm^3$ free charge carriers.

Figure 6:
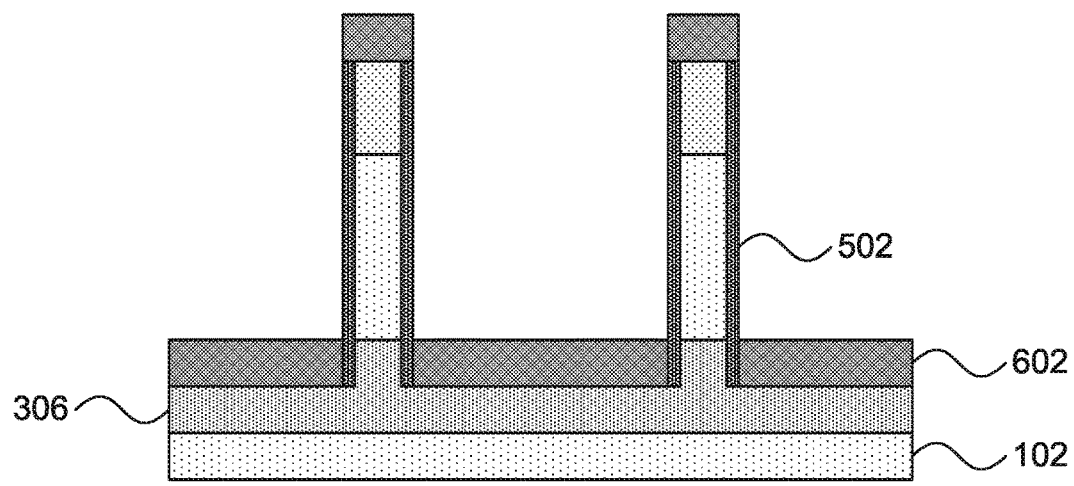
FIG. 6 is a cross-sectional diagram of a step in the formation of vertical FETs that have reduced source/drain resistance in accordance with an embodiment of the present invention.

Referring now to FIG. 6, a cross-sectional view of a step in the fabrication of a vertical FET is shown. A layer of bottom spacer material 602 is formed using a directional deposition process such as, e.g., GCIB. It is specifically contemplated that the bottom spacer material 602 can be silicoboron carbonitride or any other appropriate dielectric material.

Figure 7:
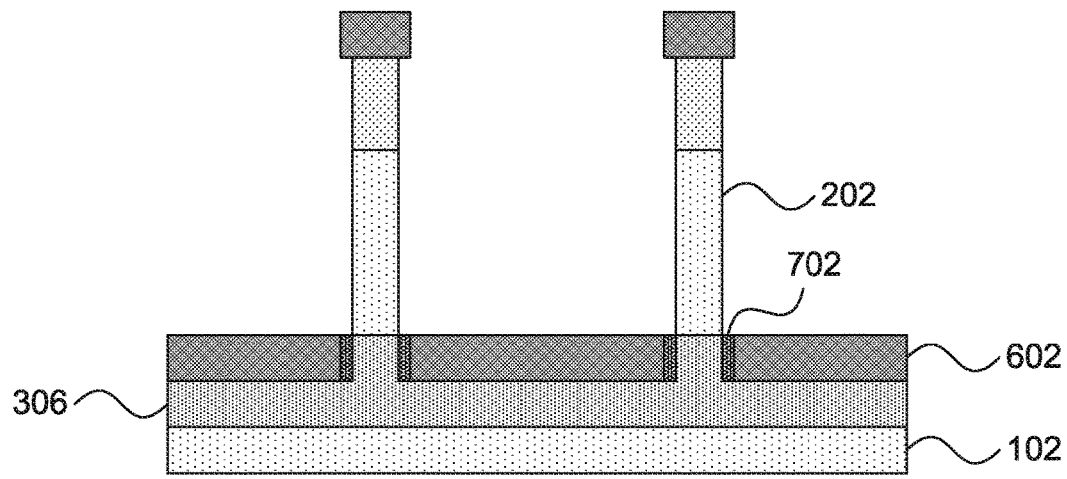
FIG. 7 is a cross-sectional diagram of a step in the formation of vertical FETs that have reduced source/drain resistance in accordance with an embodiment of the present invention.

Referring now to FIG. 7, a cross-sectional view of a step in the fabrication of a vertical FET is shown. An isotropic etch such as a wet or dry chemical etch is used to remove exposed portions of the charged dielectric spacer 502, thereby exposing the fins 202. A bottom portion 702 of the charged dielectric spacer remains, protected by the bottom spacer material 602.

Figure 8:
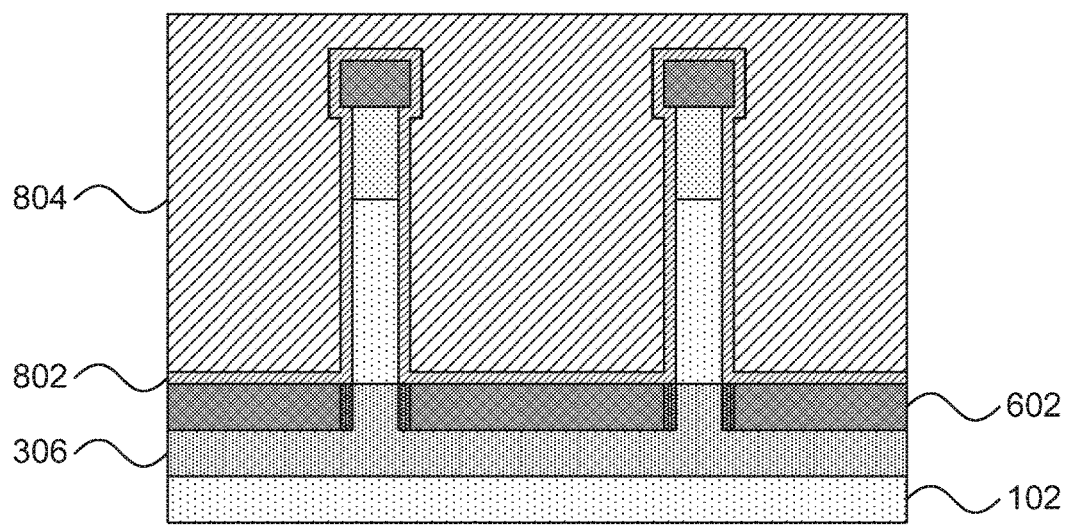
FIG. 8 is a cross-sectional diagram of a step in the formation of vertical FETs that have reduced source/drain resistance in accordance with an embodiment of the present invention.

Referring now to FIG. 8, a cross-sectional view of a step in the fabrication of a vertical FET is shown. A gate dielectric layer 802 is conformally deposited over the fins 202 and the bottom spacer material 602 by, e.g., CVD, PVD, ALD, or any other appropriate deposition process. It is specifically contemplated that the gate dielectric layer 802 may be formed from a high-k dielectric material such as, e.g., hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric may further include dopants such as lanthanum and aluminum. Any other appropriate dielectric material may be used as an alternative to a high-k dielectric. As used herein, the term, "high-k" denotes a dielectric material having a dielectric constant k that is higher than the dielectric constant of silicon dioxide.

After deposition of the gate dielectric layer 802, a gate material 804 is deposited. The gate material 804 may include a conductive metal such as, e.g., tungsten, nickel, titanium, molybdenum, tantalum, copper, platinum, silver, gold, ruthenium, iridium, rubidium, rhenium, and alloys thereof, or other conductive materials such as, e.g., doped polysilicon.

Figure 9:
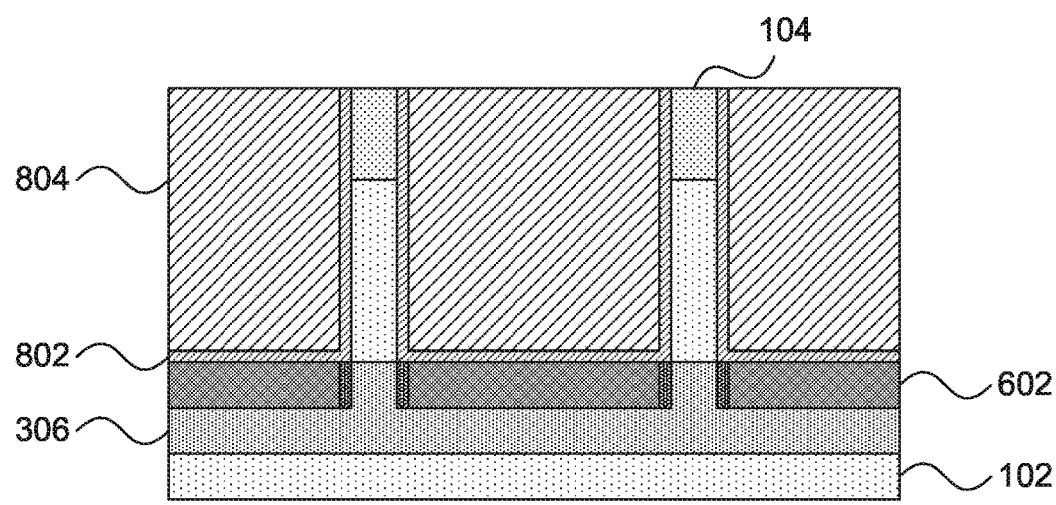
FIG. 9 is a cross-sectional diagram of a step in the formation of vertical FETs that have reduced source/drain resistance in accordance with an embodiment of the present invention.

Referring now to FIG. 9, a cross-sectional view of a step in the fabrication of a vertical FET is shown. The gate material 804 is polished down using, e.g., a chemical mechanical planarization (CMP) process that stops on the hardmask 104. CMP is performed using, e.g., a chemical or granular slurry and mechanical force to gradually remove upper layers of the device. The slurry may be formulated to be unable to dissolve, for example, silicon nitride, resulting in the CMP process's inability to proceed any farther than the hardmask 104.

Figure 10:
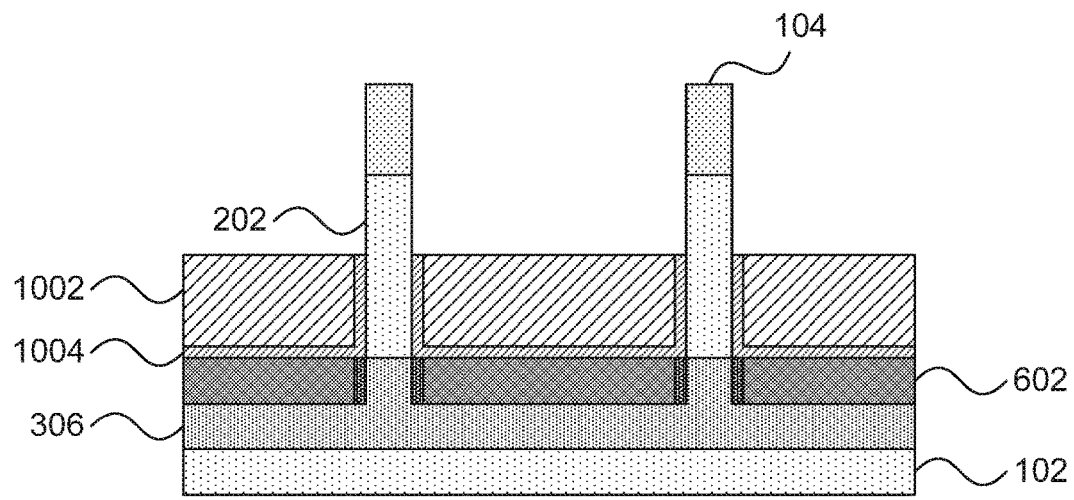
FIG. 10 is a cross-sectional diagram of a step in the formation of vertical FETs that have reduced source/drain resistance in accordance with an embodiment of the present invention.

Referring now to FIG. 10, a cross-sectional view of a step in the fabrication of a vertical FET is shown. The gate material 804 is etched back using any appropriate isotropic or anisotropic etch to form gate 1002. The exposed portions of the gate dielectric layer 802 are etched away using an isotropic etch to form gate dielectric 1004. Top portions of the fins 202 are exposed.

Figure 11:
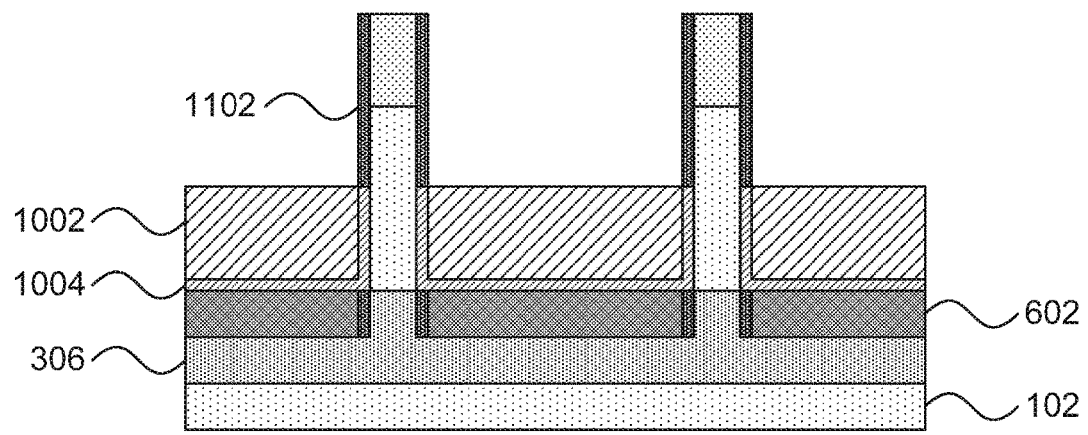
FIG. 11 is a cross-sectional diagram of a step in the formation of vertical FETs that have reduced source/drain resistance in accordance with an embodiment of the present invention.

Referring now to FIG. 11, a cross-sectional view of a step in the fabrication of a vertical FET is shown. A layer of charged dielectric material is deposited and then subsequently etched away from the horizontal surfaces using a selective anisotropic etch such as, e.g., RIE. It is specifically contemplated that the dielectric material used may be, e.g., silicon nitride, though it should be understood that other materials such as aluminum oxide may be used instead. As with the charged spacers 502 above, silicon nitride may be used for n-type FETs and aluminum oxide may be used for p-type FETs. Charged spacers 1102 are formed on the exposed upper sidewalls of the fins 202.

Figure 12:
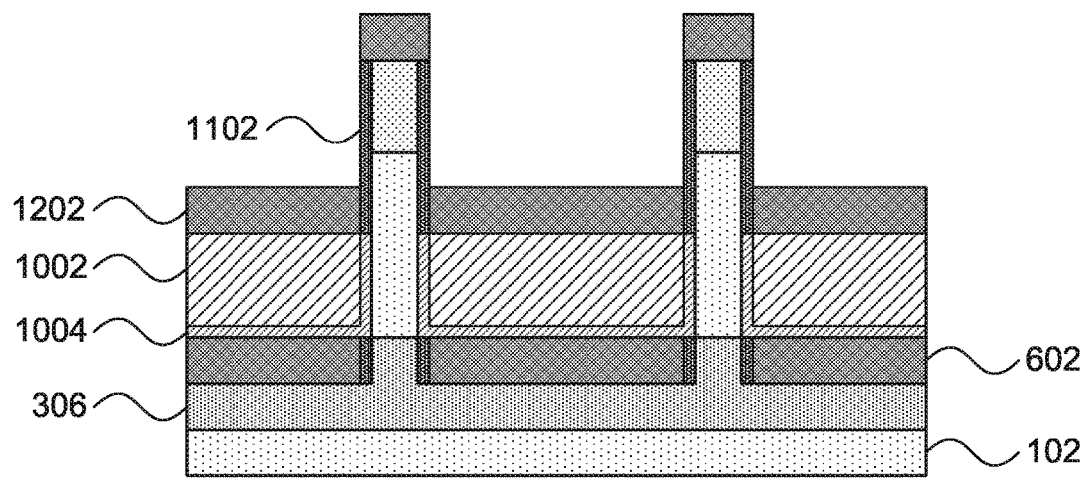
FIG. 12 is a cross-sectional diagram of a step in the formation of vertical FETs that have reduced source/drain resistance in accordance with an embodiment of the present invention.

Referring now to FIG. 12, a cross-sectional view of a step in the fabrication of a vertical FET is shown. A layer of upper spacer material 1202 is formed using a directional deposition process such as, e.g., GCIB. It is specifically contemplated that the bottom spacer material 1202 can be silicoboron carbonitride or any other appropriate dielectric material.

Figure 13:
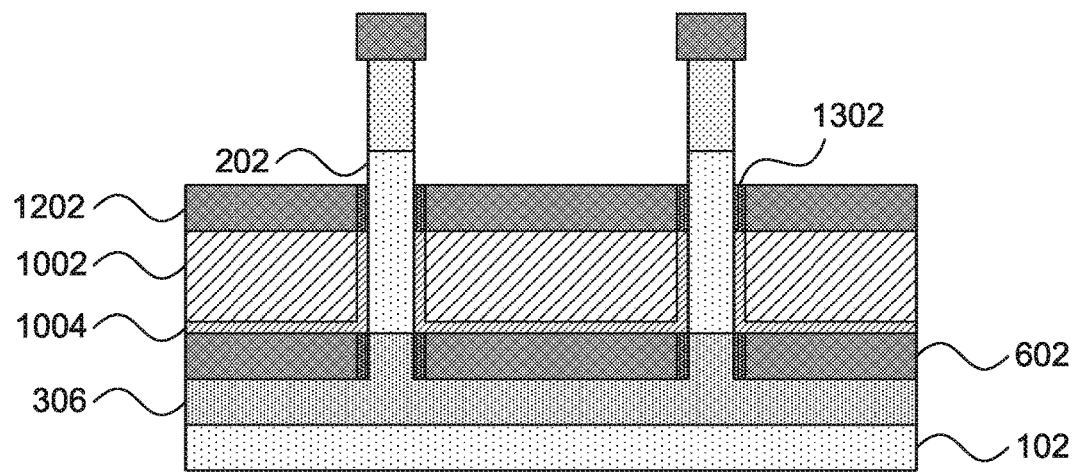
FIG. 13 is a cross-sectional diagram of a step in the formation of vertical FETs that have reduced source/drain resistance in accordance with an embodiment of the present invention.

Referring now to FIG. 13, a cross-sectional view of a step in the fabrication of a vertical FET is shown. An isotropic etch such as a wet or dry chemical etch is used to remove exposed portions of the charged upper spacer material 1202, thereby exposing the a portion of the fins 202. A top charged spacer 1302 remains, protected by the upper spacer material 1202.

Figure 14:
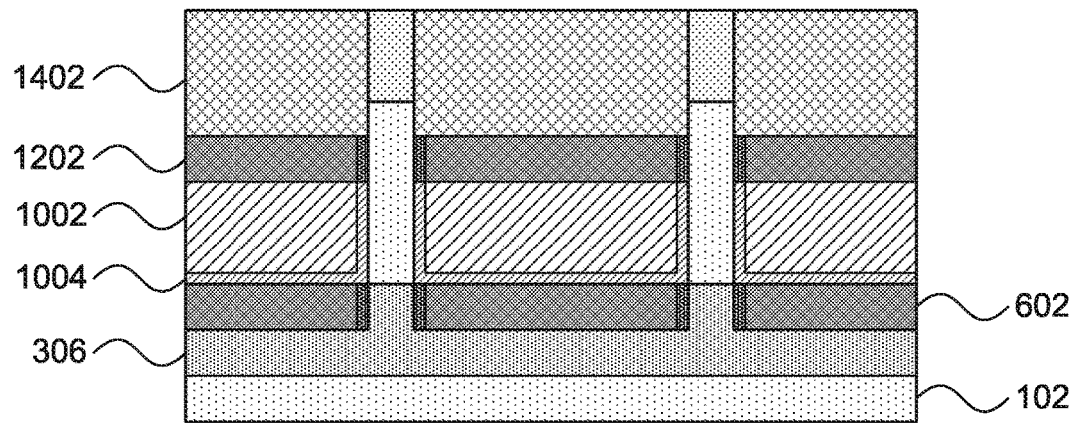
FIG. 14 is a cross-sectional diagram of a step in the formation of vertical FETs that have reduced source/drain resistance in accordance with an embodiment of the present invention.

Referring now to FIG. 14, a cross-sectional view of a step in the fabrication of a vertical FET is shown. A dielectric material 1402 such as, e.g., silicon dioxide, is filled in around the fins 202 and the hardmask 104 and then polished down using, e.g., a CMP process that stops on the hardmask 104.

Figure 15:
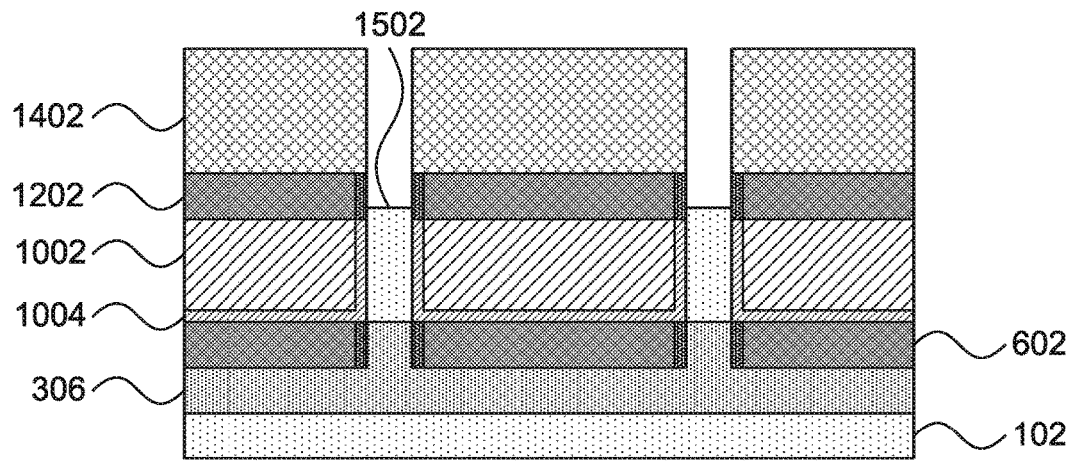
FIG. 15 is a cross-sectional diagram of a step in the formation of vertical FETs that have reduced source/drain resistance in accordance with an embodiment of the present invention.

Referring now to FIG. 15, a cross-sectional view of a step in the fabrication of a vertical FET is shown. The hardmask 104 is removed using any appropriate etch. The fins 202 are then etched back to form recessed fins 1502. Each etch may be performed using, e.g., an isotropic wet or dry chemical etch. The etch of the hardmask 104 is selective to the hardmask material, not affecting the dielectric fill 1402 or the fins 202. The etch of the fins 202 is selective to the fin material and does not affect the upper charged spacers 1302 or the gate dielectric 1004. The recessed fins 1502 may have a height that is somewhat higher than the bottom of the upper spacers 1202.

Figure 16:
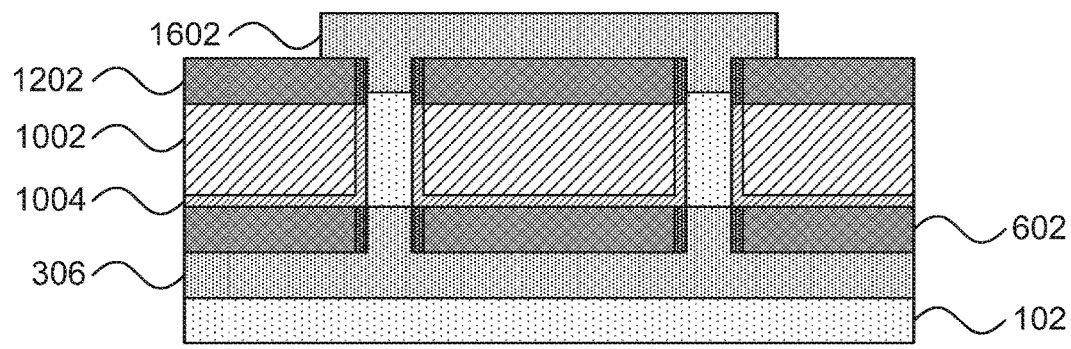
FIG. 16 is a cross-sectional diagram of a step in the formation of vertical FETs that have reduced source/drain resistance in accordance with an embodiment of the present invention.

Referring now to FIG. 16, a cross-sectional view of a step in the fabrication of a vertical FET is shown. A top source/drain extension 1602 is epitaxially grown from the exposed surface of the recessed fins 1502. The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

It is specifically contemplated that the top source/drain extension 1602 can be in situ doped with a high dopant concentration. It is specifically contemplated that the dopant concentration in the top source/drain extension 1602 may be between about $10^{18}$ cm$^{-3}$ and about $10^{22}$ cm$^{-3}$, although concentrations above and below this range are also contemplated. As noted above, the top source/drain extension 1602 may be formed with an n-type or p-type dopant as appropriate to the type of device.

Figure 17:
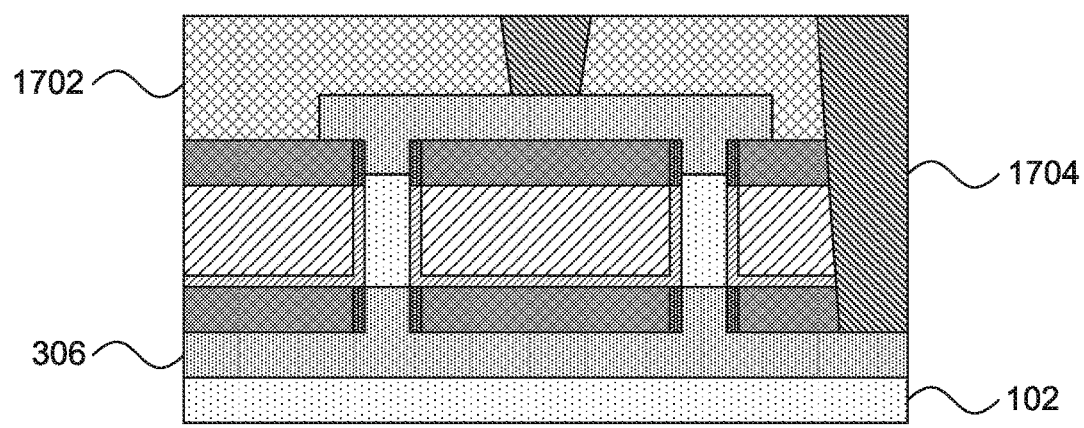
FIG. 17 is a cross-sectional diagram of a step in the formation of vertical FETs that have reduced source/drain resistance in accordance with an embodiment of the present invention.

Referring now to FIG. 17, a cross-sectional view of a step in the fabrication of a vertical FET is shown. An inter-layer dielectric 1702 is deposited using, e.g., CVD, PVD, ALD, or any other appropriate deposition process. It is specifically contemplated that silicon dioxide may be used for the inter-layer dielectric 1702, but any appropriate dielectric material may be used instead. Conductive contacts 1704 are formed by etching holes to contact the bottom source/drain extension 306 and the upper source/drain extension 1602. The conductive contacts 1704 may be formed from any appropriate conductive material, with metals such as copper, silver, aluminum, and gold being specifically contemplated. Additional contacts (not shown in this cross-section) may be formed to provide electrical connection to the gate 1002.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 18:
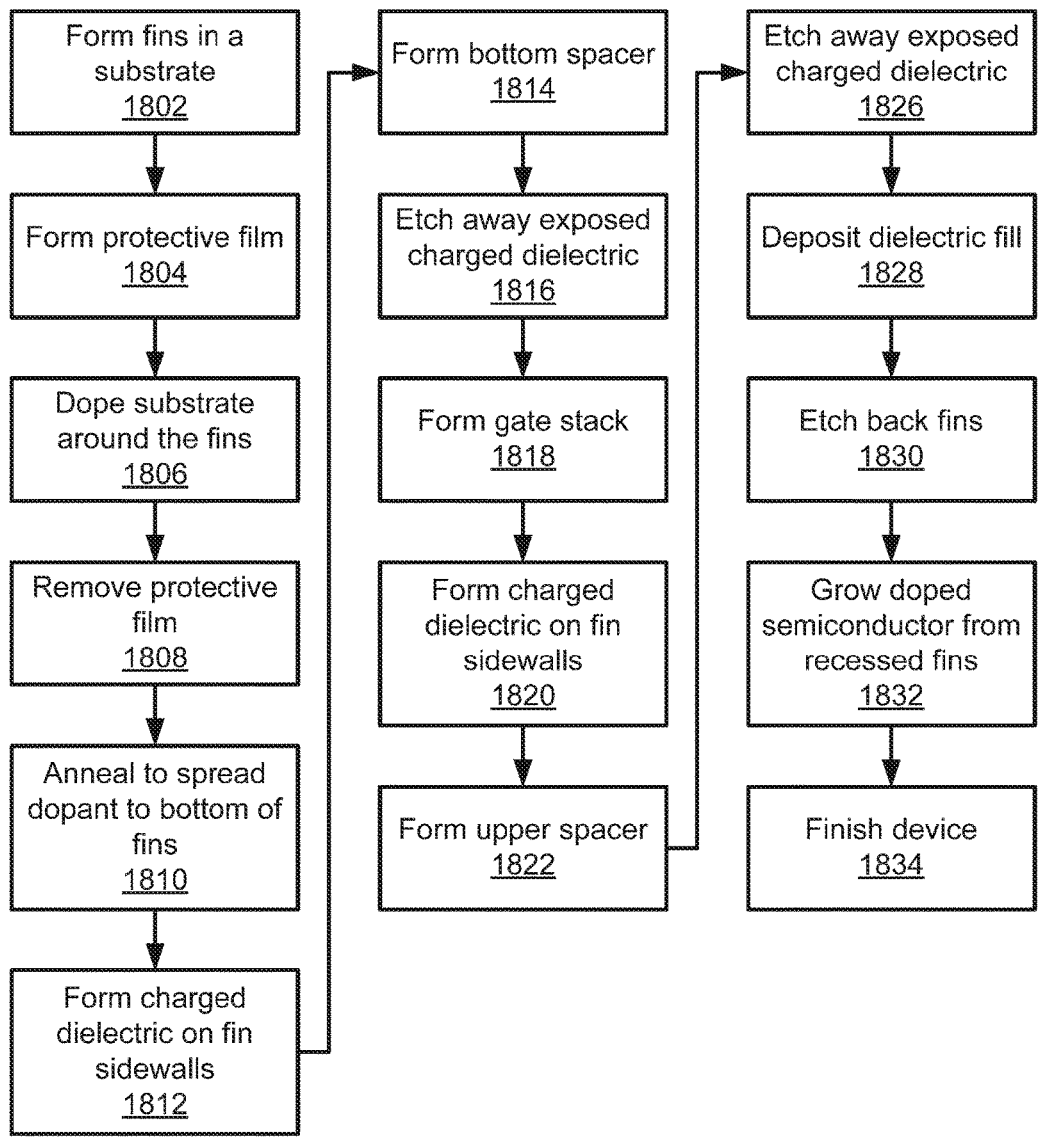
FIG. 18 is a block/flow diagram of a method of forming vertical FETs that have reduced source/drain resistance in accordance with an embodiment of the present invention.

Referring now to FIG. 18, a process for forming a vertical FET with reduced source/drain resistance is shown. Block 1802 forms fins 202 in a substrate 102 by, e.g., forming hardmask 104 and isotropically etching the substrate 102 in areas that are not protected by the hardmask 104. Block 1804 forms a protective dielectric film 302 over the fins 202, protecting the sidewalls of the fins 202 from a doping process in block 1806 that dopes the substrate 102 around the fins 202. Block 1808 removes the protective film 302.

Block 1810 anneals the doped substrate to cause the implanted dopant 306 spread to the bottom portions 406 of the fins 202. The doped regions 306 form the lower source/drain extensions. Block 1812 forms a charged dielectric layer 502 on the fin sidewalls by depositing a conformal layer of charged dielectric material and then anisotropically etching the charged dielectric material from horizontal surfaces. Block 1814 forms bottom spacer 602 using a directional deposition process such as, e.g., GCIB to form a layer of, e.g., silicoboron carbonitride. Block 1816 etches away portions of the charged dielectric layer 502 that are exposed above the bottom spacer 602, leaving behind lower charged dielectric spacers 702.

Block 1818 forms a gate stack by, e.g., conformally depositing a dielectric layer 802 followed by a gate material 804, polishing down to the level of the hardmask 104, and then etching the gate material 804 and dielectric layer 802 back to form gate 1002 and gate dielectric 1004.

Block 1820 forms a charged dielectric layer 1102 on the sidewalls of the fins 202. Block 1822 forms upper spacer 1202 by a directional deposition process such as, e.g., GCIB and block 1826 etches away exposed portions of the charged dielectric layer 1102 that are exposed above the upper spacer 1202, leaving behind upper charged dielectric spacers 702.

Block 1828 deposits dielectric fill 1402 around the fins 202 and hardmask 104 using, e.g., a flowable CVD process. Block 1830 removes the hardmask 104 and etches back the fins 202 to form recessed fins 1502 having a height that is at or above the lower surface of the upper spacers 1202. Block 1832 epitaxially grows a doped semiconductor structure from the top surfaces of the recessed fins 1502, for example using in situ doping to form upper source/drain extension 1602. Block 1834 then finishes the device by forming an interlayer dielectric 1702 and contacts 1704 that provide electrical connectivity to the source/drain regions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming semiconductor fins on a semiconductor substrate;
    forming a bottom source/drain region in the semiconductor substrate;
    forming first charged dielectric spacers on sidewalls of the semiconductor fins;
    forming a gate stack over the bottom source/drain region;
    forming second charged dielectric spacers on sidewalls of the fin above the gate stack;
    recessing the fins to a height below a top level of the second charged dielectric spacers; and
    growing a top source/drain region from the recessed fins.

2. The method of claim 1, further comprising forming a bottom spacer on the bottom source/drain region after forming the first charged dielectric spacers.

3. The method of claim 2, further comprising etching away material from the first charged dielectric spacers that is above a top level of the bottom spacer.

4. The method of claim 1, further comprising forming an upper spacer on the gate stack after forming the second charged dielectric spacers.

5. The method of claim 4, further comprising etching away material from the second charged dielectric spacers that is above a top level of the upper spacer.

6. The method of claim 1, wherein forming the bottom source/drain region comprises implanting dopants in the semiconductor substrate and annealing the substrate such that dopants diffuse into a lower portion of the fins.

7. The method of claim 1, wherein recessing the fins comprises recessing the fins to a level above a top surface of the gate stack.

8. The method of claim 1, wherein the first and second charged dielectric layers comprise a material selected from the group consisting of charged silicon nitride and charged aluminum oxide.

9. A method for forming a semiconductor device, comprising:
    forming semiconductor fins on a semiconductor substrate;
    forming a bottom source/drain region in the semiconductor substrate;

forming first charged dielectric spacers on sidewalls of the semiconductor fins;

forming a bottom spacer on the bottom source/drain region after forming the first charged dielectric spacers;

forming a gate stack over the bottom source/drain region;

forming second charged dielectric spacers on sidewalls of the fin above the gate stack;

forming an upper spacer on the gate stack after forming the second charged dielectric spacers;

recessing the fins to a height below a top level of the second charged dielectric spacers; and growing a top source/drain region from the recessed fins.

10. The method of claim 9, further comprising etching away material from the first charged dielectric spacers that is above a top level of the bottom spacer.

11. The method of claim 9, further comprising etching away material from the second charged dielectric spacers that is above a top level of the upper spacer.

12. The method of claim 9, wherein recessing the fins comprises recessing the fins to a level above a top surface of the gate stack.

13. The method of claim 9, wherein the first and second charged dielectric layers comprise a material selected from the group consisting of charged silicon nitride and charged aluminum oxide.

14. A semiconductor device, comprising:
one or more semiconductor fins formed on a semiconductor substrate;
a bottom source/drain region formed in the semiconductor substrate and a bottom portion of the one or more semiconductor fins;
a lower spacer formed above the bottom source/drain region;
first charged dielectric spacers formed on sidewalls of the semiconductor fins;
a gate stack formed above the first charged dielectric spacers and the lower spacer;
second charged dielectric spacers formed on sidewalls of the semiconductor fins above the gate stack; and
a top source/drain region formed above the gate stack and the semiconductor fins.

15. The semiconductor device of claim 14, wherein the first charged dielectric spacers have a height that is the same as a height of the lower spacer.

16. The semiconductor device of claim 14, further comprising an upper spacer formed between the gate stack and the top source/drain region.

17. The semiconductor device of claim 16, wherein the second charged dielectric spacers have a height that is the same as a height of the upper spacer.

18. The semiconductor device of claim 14, wherein the top source/drain region contacts the semiconductor fins at a height above the gate stack.

19. The semiconductor device of claim 14, wherein the first and second charged dielectric layers comprise a material selected from the group consisting of charged silicon nitride and charged aluminum oxide.

\* \* \* \* \*